US006632881B1

(12) United States Patent
Tsuchida et al.

(10) Patent No.: US 6,632,881 B1
(45) Date of Patent: Oct. 14, 2003

(54) ENCAPSULANT OF EPOXY RESIN AND LIQUID AROMATIC AMINE CURING AGENT

(75) Inventors: Satoru Tsuchida, Ibaraki-ken (JP); Masahiko Osaka, Ibaraki-ken (JP); Masatsugu Ogata, Ibaraki-ken (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/526,529

(22) Filed: Mar. 16, 2000

(30) Foreign Application Priority Data

| Apr. 13, 1999 | (JP) | ............................................ 11-104688 |
| Jan. 20, 2000 | (JP) | ........................................ 2000-014192 |
| Feb. 15, 2000 | (JP) | ........................................ 2000-036027 |

(51) Int. Cl.[7] ........................... C08K 3/36; C08L 63/00; C08L 63/02
(52) U.S. Cl. ........................ 525/65; 523/467; 525/113
(58) Field of Search ................... 525/65, 113; 428/413; 523/467

(56) References Cited

U.S. PATENT DOCUMENTS

| 4,366,108 A | * | 12/1982 | Urech et al. | ................. 528/124 |
| 4,786,675 A | * | 11/1988 | Iwata et al. | .................. 525/122 |
| 5,095,047 A | * | 3/1992 | Ogitani et al. | ............... 523/443 |
| 6,063,839 A | * | 5/2000 | Oosedo et al. | .................. 525/65 |
| 6,111,015 A | * | 8/2000 | Eldin et al. | ..................... 525/65 |
| 6,127,460 A | * | 10/2000 | Kazuto | ........................ 525/443 |

FOREIGN PATENT DOCUMENTS

| CA | 2164915 A1 | * | 6/1996 |
| EP | 659833 A1 | * | 6/1995 |
| JP | 48-85700 A | * | 11/1973 |
| JP | 61-151231 A | * | 7/1986 |
| JP | 9-67553 A | * | 3/1997 |
| WO | WO-97/12009 A1 | * | 4/1997 |

OTHER PUBLICATIONS

Day et al., Polym. Inst. (1997), vol. 44, No. 3, pp. 288–299.*

* cited by examiner

*Primary Examiner*—Robert E. L. Sellers
(74) *Attorney, Agent, or Firm*—Antonelli, Terry, Stout & Kraus, LLP

(57) ABSTRACT

An encapsulating epoxy resin composition comprising an epoxy resin which is liquid at normal temperature, a curing agent containing an aromatic amine which is liquid at normal temperature, an inorganic filler, and rubber particles; an encapsulant comprising this composition; and an electronic device having an encapsulating member comprising a cured product of this encapsulant.

15 Claims, 1 Drawing Sheet

ENCAPSULANT OF EPOXY RESIN AND LIQUID AROMATIC AMINE CURING AGENT

This application is based on Japanese Patent Applications No. 11-104688, No. 2000-014192 and No. 2000-036027 filed in Japan, the contents of which are incorporated hereinto by reference.

BACKGROUND OF THE INVENTION

1. Field of the Invention

This invention relates to an epoxy resin composition and an encapsulant especially suited for the encapsulation of electronic devices severely required to have reliability, and an electronic device having an encapsulating member comprising a cured product of this composition.

2. Description of Related Art

In electronic devices such as semiconductor devices, semiconductor device components such as ICs (integrated circuits) or LSIs (large-scale integrated circuits) are encapsulated with resin. Epoxy resin compositions are chiefly used for such encapsulation.

In recent years, in order to make electronic devices low-costing, small-sized, light-weighted and also make them of high-performance and high-function, device components are being made to be mounted in a higher density, be more finely wired, be more multi-layered and be more multi-pinned, and being made to occupy a larger area in one package. With such progress, what is prevailing is being shifted from conventional pin-insert type packages such as DIP (dual in-line package) formed by transfer molding making use of solid epoxy resin, toward surface-mount type packages such as PPGA (plastic pin grid array), BGA (ball grid array) and CPS (chip size package). In some uses, bare-chip packaging has also been put into practice.

In such surface-mount packaging, liquid epoxy resin compositions are in wide use as encapsulants. Liquid epoxy resin compositions of this type are acid anhydride type epoxy resin compositions usually prepared using as base resins a liquid epoxy resin and an acid anhydride type curing agent advantageous for providing a low viscosity, and by mixing therein a curing accelerator and an inorganic filler and further appropriately mixing various additives such as a coupling agent, a colorant and a leveling agent.

Such acid anhydride type epoxy resin compositions, however, tend to cause an abrupt decrease in their adhesion to organic substrates or inorganic substrates in moisture resistance tests such as PCT (pressure cooker test), and tend to cause Interfacial separation due to a thermal stress that is produced because of a difference in coefficient of thermal expansion between resin, semiconductor chips and an organic substrate. Hence, electronic devices encapsulated with conventional acid anhydride type epoxy resin compositions have a disadvantage that they may have poor moisture resistance reliability and thermal-shock resistance.

SUMMARY OF THE INVENTION

The present invention was made taking account of such circumstances. Accordingly, an object of the present invention is to provide an epoxy resin composition having superior moisture-resistant adhesion and low-stress properties, an encapsulant comprising this composition, and an electronic device having a high reliability (moisture resistance and thermal-shock resistance), encapsulated with this encapsulant.

The present inventors made extensive studies on various curing agents and low-stress endowers in order to obtain an epoxy resin composition having superior moisture-resistant adhesion and low-stress properties. As the result, they have discovered that, where a curing agent containing a liquid aromatic amine is used as the curing agent and solid rubber particles are used as the low-stress endower, an epoxy resin composition can be obtained which has been improved In moisture-resistant adhesion to various substrates to have a superior reliability and may cause less decrease in heat resistance and have a higher low-stress effect than those making use of a liquid flexibilizer as the low-stress endower. Thus, they have accomplished the present invention.

The present invention provides an encapsulating epoxy resin composition comprising an epoxy resin which is liquid at normal temperature, a curing agent containing an aromatic amine which is liquid at normal temperature, rubber particles, and an inorganic filler; an encapsulant comprising this composition; and an electronic device having an encapsulating member comprising a cured product of this encapsulant.

The rubber particles may preferably be comprised of an acrylic rubber, and may more preferably be those having a core/shell structure. In particular, preferred in the present invention are particles of an acrylic rubber having a core/shell structure (i.e., core/shell type acrylic rubber particles) having a core comprised of a polymer which is rubbery at normal temperature and has a glass transition temperature of from −80° C. to 0° C. and a shell comprised of a polymer which is glassy at normal temperature and has a glass transition temperature of from 50° C. to 150° C.

The aromatic amine may preferably comprise at least one of 3,3'-diethyl-4,4'-dlaminodiphenylmethane and diethyltoluenediamine. These may each be used alone or may be used in the form of a mixture.

DETAILED DESCRIPTION OF THE INVENTION

1. Constituents

Figure 1:
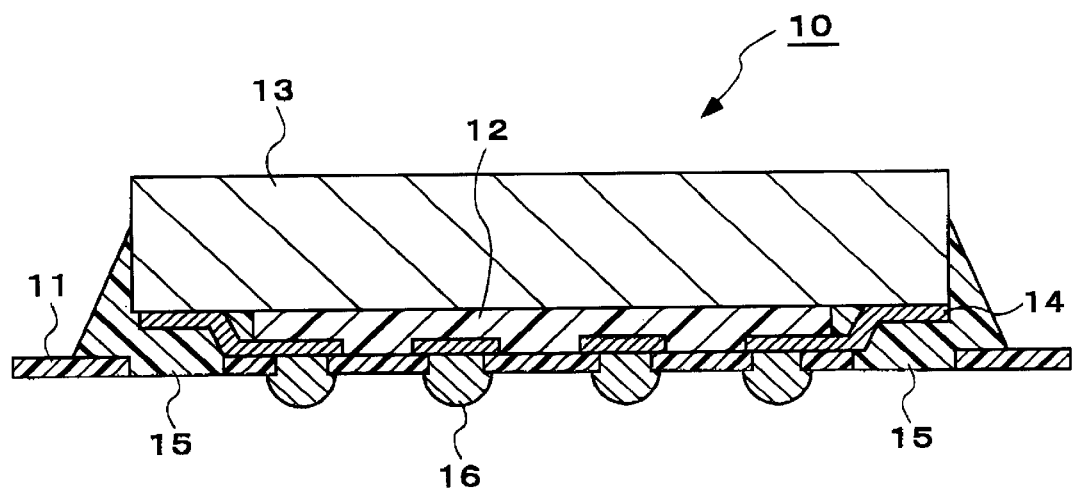
FIG. 1 is a cross-sectional view showing an example of the structure of a resin-encapsulated semiconductor device.

The epoxy resin composition of the present invention comprises an epoxy resin, a curing agent, rubber particles, and an inorganic filler. The respective constituents will be described below.

(1) Epoxy Resin

There are no particular limitations on the epoxy resin used in the present invention as long as it has at least one epoxy group in one molecule and is liquid at normal temperature. For example, it may appropriately be selected from liquid epoxy resins commonly used in epoxy resin compositions for encapsulating semiconductor devices.

The epoxy resin composition of the present invention may also be used in combination with a solid epoxy resin as long as the effect of the present invention can be achieved. The solid epoxy resin used in combination may preferably be in an amount not more than 20% by weight based on the total weight of the epoxy resin.

The epoxy resin usable in the present invention may include, e.g.;

epoxidized products of novolak resin obtained from phenols and aldehydes, such as diglycidyl ether type epoxy resins and orthocresol novolak type epoxy resins obtained from bisphenol A, bisphenol F, bisphenol AD, bisphenol D, hydrogenated bisphenol A or the like,;

glycidyl ester type epoxy resins obtained by the reaction of polybasic acids such as phthalic acid and dimer acid with epichlorohydrin;

glycidylamine type epoxy resins obtained by the reaction of polyamines such as diaminodiphenylmethane and isocyanuric acid with epichlorohydrin; and linear aliphatic epoxy resins and alicyclic epoxy resins, obtained by the oxidation of olefinic bonds with peracids such as peracetic acid. Any of these may be used alone or in combination of two or more types.

These epoxy resins may desirably be those having well been purified and may preferably contain ionic impurities as less as possible. For example, ionic impurities such as free $Na^+$ and $Cl^-$ may preferably be not more than 500 ppm.

(2) Curing Agent

There are no particular limitations on the curing agent used in the present invention as long as it contains an amine which has an aromatic ring and is liquid at normal temperature. Such a curing agent is commercially available as, e.g., EPICURE W and EPICURE Z (both trade names; available from Yuka Shell Epoxy K.K.); KAYAHARD A-A, KAYAHARD A-E and KAYAHARD A-S (all trade names; available from Nippon Kayaku Co., Ltd.); TOHTO AMINE HM-205 (trade name; available from Tohto Kasel Co, Ltd.); ADEKA HARDENER EH-101 (trade name; available from Asahi Denka Kogyo K.K.); EPOMIK Q-640 and EPOMIK Q-643 (trade names; available from Mitsui Chemicals Inc.); and DETDA 80 (trade name; available from Lonza Co.). Any of these may be used alone or in combination of two or more types.

As the amine which is liquid at normal temperature, contained in the curing agent, 3,3-diethyl-4,4'-diamlnodiphenylmethane [i.e., di(4-amino-3-ethylphenyl)methane] and dlethyltoluenediamlne are preferred from the viewpoint of storage stability. The curing agent may preferably chiefly be composed of any of these or a mixture of these. Incidentally, the diethyltoluenediamine may specifically include 3,5-diethyltoluene-2,4-diamine (i.e., 1,3-diamino-2,4-diethyl-6-methylbenzene) and 3,5-diethyltoluene2,6-diamine (i.e., 1,3-diamino-4,6-diethyl-2-methylbenzene), either of which may be used. A mixture of these may also be used, which may preferably contain at least 60% by weight of 3,5-diethyltoluene-2,4-diamine.

In the encapsulating epoxy resin composition of the present invention, in addition to the above curing agent, an additional curing agent may further be used in combination as long as the effect of the present invention can be achieved. The curing agent used in combination may be solid. The curing agent usable in combination may be selected from curing agents commonly used in epoxy resin compositions for encapsulating semiconductor devices, as exemplified by phenolic curing agents and acid anhydrides. In the case when such an additional curing agent is used in combination, in order for its performance to be exhibited, the liquid aromatic amine may preferably be mixed in an amount of at least 60% by weight based on the total weight of the curing agent.

There are no particular limitations on the equivalent weight ratio of the curing agent to the whole epoxy resin. In order to keep any unreacted matter of each constituent less, the ratio may preferably be set within the range of from 0.7:1 to 1.6:1 equivalent weight, more preferably from 0.8:1 to 1.4:1 equivalent weight, and still more preferably from 0.9:1 to 1.2:1 equivalent weight.

(3) Rubber Particles

There are no particular limitations on the rubber particles used in the present invention. From the viewpoint of improvement in moisture-resistant adhesion and moisture-resistance reliability, particles of an acrylic polymer, i.e., an acrylic rubber are preferred, and particles of a core/shell type acrylic polymer are more preferred. In particular, core/shell type acrylic rubber particles in which the core is comprised of a rubbery polymer having a glass transition temperature of from −80° C. to 0° C. and the shell is comprised of a glassy polymer having a glass transition temperature of from 50° C. to 150° C. are preferred from the viewpoints of an improvement in adhesion and the low-stress effect. A functional group such as a carboxyl group, a hydroxyl group or an epoxy group may partly be contained in the polymer that forms the shell, and such rubber particles are more preferred because their compatibility with and dispersibility in the epoxy resin composition are improved. Such rubber particles are commercially available as, e.g., products of Takeda Chemical Industries, Ltd. and Nippon Zeon Co., Ltd.

The rubber particles may preferably have, but not particularly limited to, an average particle diameter ranging from 0.01 to 20 $\mu$m, and more preferably ranging from 0.1 to 10 $\mu$m. Those having an average particle diameter smaller than 0.01 $\mu$m tend to have a poor dispersibility in the liquid epoxy resin composition. Those having an average particle diameter larger than 20 $\mu$m tend to have a low improvement effect for making low-stress, or may make the resultant composition have a low penetrability and flowability to minute gaps as a liquid encapsulant to tend to cause occurrence of voids or short molding.

The rubber particles may preferably be mixed in an amount ranging from 1 to 30% by weight, more preferably from 2 to 25% by weight, and still more preferably form 3 to 20% by weight, based on the total weight of the epoxy resin composition. Rubber particles mixed in an amount less than 1% by weight tend to have an insufficient low-stress effect, and those in an amount more than 30% by weight may make the liquid encapsulant have a high viscosity to provide a poor moldabillty (flowability).

(4) Inorganic Filler

In the epoxy resin composition of the present invention, usable as the inorganic filler are, e.g., silica such as fused silica and crystalline silica, calcium carbonate, clay, alumina such as fused alumina, silicon nitride, silicon carbide, boron nitride, calcium silicate, potassium titanate, aluminum nitride, beryllia, zirconia, zircon, foraterite, steatite, spinel, mullite and titania. These may be used in the form of powder, or beads of any of these made spherical. Glass fibers may also be used. Also, in the epoxy resin composition of the present invention, inorganic fillers having a flame-retardant effect may also be mixed, as exemplified by aluminum hydroxide, magnesium hydroxide, zinc borate and zinc molybdate. Any of these inorganic fillers may be used alone or in combination of two or more types. In particular, silica is preferred, and spherical silica is more preferred from the viewpoint of the resin encapsulant's flowability and penetrability to minute gaps.

The inorganic filler, especially in the case of spherical silica, may preferably have an average particle diameter ranging from 1 to 20 $\mu$m, and may more preferably an average particle diameter ranging from 2 to 10 $\mu$m. If it has an average particle diameter smaller than 1 $\mu$m, it tends to have a poor dispersibility in the liquid resin, or the liquid encapsulant may have thixotropic properties to tend to have a poor flowabillty. If it has an average particle diameter larger than 20 $\mu$m, it tends to cause filler sedimentation, or may make the resultant composition have a low penetrability to minute gaps and a low flowability as a liquid encapsulant to tend to cause occurrence of voids or short molding.

The inorganic filler must be mixed in an amount ranging from 20 to 90% by weight, more preferably from 25 to 80% by weight, and still more preferably from 30 to 60% by weight, based on the total weight of the epoxy resin composition. If it is mixed in an amount less than 20% by weight, the effect of reducing coefficient of thermal expansion tends to lower. If it is in an amount more than 90% by weight, the epoxy resin composition may have a high viscosity to tend to cause a decrease in its flowabillty, penetrability and dispensability.

(5) Additives

The epoxy resin composition of the present invention may optionally be mixed with additives such as a coupling agent, a flame retardant, an ion trapping agent, a catalyst, a diluent, a colorant, a leveling agent, an anti-foaming agent and/or a solvent. Each of the above additives may be used itself alone or may be used in combination of two or more additives.

There are no particular limitations on the additive used as a coupling agent, and those conventionally known may optionally be used under appropriate selection. Coupling agents preferable in the present invention may include, e.g., silane type coupling agents such as epoxy-group-containing silanes, amino-group-containing silanes, mercapto-group-containing silanes and ureido-group-containing silanes, titanium type coupling agents such as organic titanate, aluminum chelates such as aluminum alcoholates, and aluminum/zirconium type coupling agents. Any of these may be used alone or in combination of two or more types.

There are no particular limitations on the additive used as a flame retardant, and those conventionally known may optionally be used under appropriate selection. Flame retardants preferable in the present invention may include, e.g., brominated epoxy resins, antimony oxides (such as antimony trioxide, antimony tetraoxide and antimony pentaoxide), red phosphorus, phosphates, compounds having a triazine ring (such as melamine and melamine derivatives), phosphorus-nitrogen type compounds (such as cyclophosphazene), and metal compounds (such as metal hydroxides, zinc oxide, iron oxide, molybdenum oxide and ferrocene). Any of these may be used alone or in combination of two or more types.

There are no particular limitations on the additive used as an ion-trapping agent, and those conventionally known may optionally be used under appropriate selection. Ion-trapping agents preferable in the present invention may include, e.g., hydrotalcites, and hydrous oxides such as a hydrous oxide of bismuth, antimony, zirconium, titanium, tin, magnesium or aluminum. In particular, hydrotalcites and a hydrous oxide of bismuth are preferred. Any of these ion-trapping agents may be used alone or in combination of two or more types.

There are no particular limitations on the catalyst as far as it has curing acceleration effects, and those conventionally known may optionally be used under appropriate selection. Catalysts preferable in the present invention may include, e.g., cycloamidine compounds, tertiary amines, imidazoles, organophosphines, phosphorus compounds, tetraphenylborates and derivatives of these. Any of these may be used alone or in combination of two or more types.

2. Production of Epoxy Resin Composition

The epoxy resin composition of the present invention may be prepared by any methods as long as the respective constituents described above can uniformly be dispersed and mixed. Usually, it may be produced by dispersing and kneading the constituents by means of, e.g., a three-roll mill or an automated mortar.

3. Electronic Device

The epoxy resin composition of the present invention can improve the moisture resistance reliability and thermal-shock resistance of products, and hence is suitable to the encapsulation of device components in electronic devices. Accordingly, there is provided an encapsulant comprising the epoxy resin composition of the present invention, and an electronic device encapsulated with this encapsulant, i.e., an electronic device having an encapsulating member comprising a cured product of the encapsulant of the present invention.

The electronic device of the present invention may include electronic devices comprising a support member such as a lead frame, a wired tape carrier, a wiring board, a glass sheet or a silicon wafer, and mounted thereon a component or components including active components such as a semiconductor chip, a transistor, a diode and a thyristor and/or passive components such as a capacitor, a resistor and a coil, the necessary part of which has been encapsulated with the epoxy resin composition of the present invention.

Such electronic devices may include, e.g.;

commonly available resin-encapsulated ICs such as PLCC (plastic-leaded chip carrier), QFP (quad flat package), SOP (small outline package), SOJ (small outline J-lead package), TSOP (thin small outline package) and TQFP (thin quad flat package) in which semiconductor components are fastened onto a lead frame, and terminals and leads such as bonding pads of each device component are connected by wire bonding or through bumps, followed by encapsulation with the epoxy resin composition of the present invention by transfer molding or the like;

TCPs (tape carrier packages) in which semiconductor chips bonded to a tape carrier through bumps are encapsulated with the epoxy resin composition of the present invention;

COB (chip-on-board) modules, hybrid ICs and multichip modules in which device components are bonded to wirings formed on a wiring board or glass sheet, by wire bonding, flip-chip bonding or soldering, and the device components thus bonded are encapsulated with the epoxy resin composition of the present invention; and BGAs (ball grid arrays) and CSPs (chip size packages) in which device components are mounted on an organic substrate on the back of which terminals for wiring-board connection have been formed, and the device components are connected to wirings formed on the organic substrate, followed by encapsulation with the epoxy resin composition of the present invention. The epoxy resin composition of the present invention is also effectively usable to encapsulate electronic devices making use of printed circuit boards.

As methods for encapsulating electronic devices by the use of the epoxy resin composition obtained in the present invention, dispensing, casting or printing may be used.

THE PREFERRED EMBODIMENT

The present invention will be described in greater detail by giving Examples. The present invention is by no means limited to these.

1. Test and Evaluation

Test methods for performance evaluation made in Examples and Comparative Examples are shown below together. In the following, packages and test pieces were prepared by molding the encapsulant by dispensing under heating conditions of 150° C. for 3 hours.

(1) Viscosity:

Viscosity of the encapsulant at 25° C. was measured with an E-type viscometer (number of revolutions: 5 rpm).

(2) Moisture-resistant Adhesion:

A test piece was formed on one side of aluminum foil (thickness: 30 µm) or polyimide film (thickness: 75 µm). Using AUTOGRAPH AGS-500 A (trade name; manufactured by Shimadzu Corporation), the aluminum foil or polyimide film, having a width of 10 mm, was peeled in the vertical direction under conditions of a head speed of 30 mm/minute to measure its strength (peel strength: N/m). This measurement was made immediately after the test piece was prepared by molding, and after test pieces were respectively treated for 72 hours, 168 hours, 240 hours under PCT conditions of 121° C., 0.2 MPa and 100% RH.

(3) Moisture Resistance Reliability:

As shown in FIG. 1, to a TAB (tape automated bonding) tape 11 (made of polyimide; provided with aluminum zigzag wiring), a TEG (test element group) chip 13 was fastened with an adhesive (an elastomer) 12, followed by ultrasonic bonding to a beam lead 14. Next, an encapsulant 15 was molded under the above conditions by dispensing in such a way that the part where the tape 11 was fastened to the chip 13 and the part where the chip 13 was fused to the beam lead are covered, followed by post-curing treatment, and solder balls 16 were mounted to produce an evaluation BGA package 10.

This evaluation BGA package 10 was treated for 240 hours under PCT conditions of 121° C., 0.2 MPa and 100% RH. Thereafter, whether or not any separation occurred between the encapsulating member and the chip and between the encapsulating member and the polyimide film was examined by means of an ultrasonic flaw detector AT5500 (trade name; manufactured by Hitachi Kenki K.K.) and also whether or not aluminum pads corroded was examined with an infrared microscope, to evaluate moisture resistance reliability by (the number of faulty packages)/(the number of packages examined).

(4) Thermal-shock Resistance:

An evaluation BGA package prepared in the same manner as the above was treated by 1,000 cycles in a heat cycle of −50° C./150° C. for 30 minutes each, to examine any disconnection of aluminum wiring, and the thermal-shock resistance was evaluated by (the number of faulty packages)/(the number of packages examined).

2. Examples 1 to 7 & Comparative Examples 1 to 3

As the liquid epoxy resin, bisphenol-F epoxy resin having an epoxy equivalent weight of 160 (YDF-8170C, trade name; available from Tohto Kasei Co., Ltd.);

as the curing agent, 3,3'-diethyl-4,4'-diaminodiphenylmethane (KAYAHARD A-A, trade name; available from Nippon Kayaku Co., Ltd.; herein "liquid aromatic amine 1"), having an active-hydrogen equivalent weight of 63, EPOMIK Q-640 (trade name; available from Mitsui Chemicals Inc.; herein "liquid aromatic amine 2"), having an active-hydrogen equivalent weight of 114, EPICURE W (trade name; available from Yuka Shell Epoxy K.K.; herein "liquid aromatic amine 3"), having an active-hydrogen equivalent weight of 45, diethyltoluenediamine (DETDA 80, trade name; available from Lonza Co.; herein "liquid aromatic amine 4"), having an active-hydrogen equivalent weight of 48, or MH-700 (trade name; a liquid acid anhydride available from Shin Nippon Rika K.K.), having an acid anhydride equivalent weight of 168;

as the rubber particles, STAPHYLOID AC-3355 (trade name; available from Takeda Chemical Industries, Ltd.; herein "rubber particles 1"), STAPHYLOID AC-3832 (trade name; available from Takeda Chemical Industries, Ltd.; herein "rubber particles 2"), or silicone rubber particles having an average particle diameter of 5 µm (herein "rubber particles 3");

as the inorganic filler, spherical fused silica having an average particle diameter of 4 µm; and as the catalyst, 2-ethyl-4-methylimidazole; were mixed under the formulation as shown respectively in Table 1 or 2. The mixtures obtained were each kneaded and dispersed by means of a three-roll mill, followed by vacuum deaeration to prepare an epoxy resin composition. Using this composition as the encapsulant, evaluation was made in the manner as described above. The results of evaluation on each item are shown in Tables 3 and 4.

TABLE 1

Mixing Formulation (pbw)

| Mixing Constituents | Example 1 | 2 | 3 | 4 | 5 | 6 | 7 |
|---|---|---|---|---|---|---|---|
| Bisphenol-F epoxy resin | 100 | 100 | 100 | 100 | 100 | 100 | 100 |
| Liquid aromatic amine 1 | 40 | — | — | 35 | 29 | 40 | — |
| Liquid aromatic amine 2 | — | 70 | — | 9 | — | — | — |
| Liquid aromatic amine 3 | — | — | 28 | — | 7 | — | — |
| Liquid aromatic amine 4 | — | — | — | — | — | — | 30 |
| Liquid acid anhydride | — | — | — | — | — | — | — |
| Catalyst | — | — | — | — | — | — | — |
| Rubber particles 1 | 20 | — | — | — | 40 | — | 30 |
| Rubber particles 2 | — | 20 | 20 | 15 | — | — | — |
| Rubber particles 3 | — | — | — | — | — | 20 | — |
| Inorganic filler | 110 | 190 | 80 | 240 | 120 | 110 | 196 |
| Amount of rubber particles (wt. %) | 7.4 | 5.3 | 8.8 | 3.8 | 13.5 | 7.4 | 8.4 |
| Amount of inorganic filler (wt. %) | 41 | 50 | 35 | 60 | 41 | 41 | 55 |

TABLE 2

Mixing Formulation (pbw)

| Mixing constituents | Comparative Example 1 | 2 | 3 |
|---|---|---|---|
| Bisphenol-F epoxy resin | 100 | 100 | 100 |
| Liquid aromatic amine 1 | — | 40 | — |
| Liquid aromatic amine 2 | — | — | — |
| Liquid aromatic amine 3 | — | — | — |
| Liquid aromatic amine 4 | — | — | — |
| Liquid acid anhydride | 95 | — | 95 |
| Catalyst | 1 | — | 1 |

TABLE 2-continued

| | Mixing Formulation (pbw) | | |
|---|---|---|---|
| | | Comparative Example | |
| Mixing constituents | 1 | 2 | 3 |
| Rubber particles 1 | — | — | 50 |
| Rubber particles 2 | — | — | — |
| Rubber particles 3 | — | — | — |
| Inorganic filler | 300 | 95 | 246 |
| Amount of rubber particles (wt. %) | 0.0 | 0.0 | 10.2 |
| Amount of inorganic filler (wt. %) | 60 | 40 | 50 |

TABLE 3

| | | Evaluation Results | | | | | | |
|---|---|---|---|---|---|---|---|---|
| | | Example | | | | | | |
| Evaluation Item | Unit | 1 | 2 | 3 | 4 | 5 | 6 | 7 |
| Viscosity | Pa·s | 6.9 | 12 | 5.5 | 56 | 20 | 7.8 | 10 |
| Moisture-resistant adhesion | | | | | | | | |
| Aluminum foil | | | | | | | | |
| Initial value | N/m | 1100 | 1000 | 980 | 1200 | 1000 | 930 | 1000 |
| PCT 72 hrs | | 980 | 920 | 710 | 1050 | 740 | 410 | 950 |
| PCT 168 hrs | | 740 | 880 | 660 | 830 | 700 | 380 | 760 |
| PCT 240 hrs | | 650 | 850 | 600 | 770 | 710 | 310 | 680 |
| Polyimide | | | | | | | | |
| Initial value | | 220 | 200 | 160 | 180 | 210 | 145 | 220 |
| PCT 72 hrs | | 210 | 180 | 130 | 180 | 200 | 100 | 200 |
| PCT 168 hrs | | 210 | 150 | 130 | 170 | 180 | 50 | 190 |
| PCT 240 hrs | | 190 | 150 | 120 | 175 | 160 | 30 | 180 |
| Moisture resistance reliability | | | | | | | | |
| Separation from chip | — | 0/10 | 0/10 | 0/10 | 0/10 | 0/10 | 3/10 | 0/10 |
| Separation from polyimide film | | 0/10 | 0/10 | 0/10 | 0/10 | 0/10 | 5/10 | 0/10 |
| Corrosion of aluminum pads | | 0/10 | 0/10 | 0/10 | 0/10 | 0/10 | 2/10 | 0/10 |
| Thermal-shock resistance | — | 0/10 | 0/10 | 0/10 | 0/10 | 0/10 | 0/10 | 0/10 |

TABLE 4

| | | | Evaluation Results | | |
|---|---|---|---|---|---|
| | | | | Comparative Example | |
| Evaluation Item | | | Unit | 1 | 2 | 3 |
| Viscosity | | | Pa·s | 11 | 4.3 | 25 |
| Moisture-resistant adhesion | Aluminum foil | Initial value | N/m | 850 | 1000 | 920 |
| | | PCT 72hrs | | 0 | 570 | 80 |
| | | PCT168hrs | | — | 430 | 0 |
| | | PCT240hrs | | — | 380 | — |
| | Polyimide | Initial value | | 120 | 160 | 150 |
| | | PCT 72hrs | | 0 | 120 | 0 |
| | | PCT168hrs | | — | 70 | — |
| | | PCT240hrs | | — | 30 | — |
| Moisture resistance reliability | Separation from chip | | — | 9/10 | 4/10 | 8/10 |
| | Separation from polyimide film | | | 10/10 | 6/10 | 6/10 |
| | Corrosion of aluminum pads | | | 10/10 | 3/10 | 10/10 |
| Thermal-shock resistance | | | — | 5/10 | 3/10 | 1/10 |

Comparative Example 1, in which neither the curing agent containing a liquid aromatic amine nor the rubber particles were used, showed very inferior moisture-resistant adhesion, moisture resistance reliability and thermal-shock resistance. Comparative Example 2, in which the curing agent containing a liquid aromatic amine was used but the rubber particles were not used, showed an improvement effect in moisture-resistant adhesion and moisture resistance reliability, but showed an inferior thermal-shock resistance. Also, Comparative Example 3, in which the rubber particles were used but the curing agent containing a liquid aromatic amine was not used, showed an improvement effect in thermal-shock resistance, but showed inferior moisture-resistant adhesion and moisture resistance reliability.

On the other hand, Examples 1 to 7 showed an improvement effect in moisture-resistant adhesion and moisture resistance reliability, and also showed a superior thermal-shock resistance on account of the low-stress effect attributable to the mixing of rubber particles. Also, Examples 1 to 5 and 7, in which the core/shell type acrylic rubber particles were used as the rubber particles, showed an especially high moisture-resistant adhesion, so that a remarkable improvement effect was seen in moisture resistance reliability.

What is claimed is:
1. An encapsulant, comprising an epoxy resin composition which includes an epoxy resin which is liquid at normal temperature, a curing agent and an inorganic filler;

said composition further comprising rubber particles; and said curing agent including a liquid aromatic amine which is liquid at normal temperature, said liquid aromatic amine being at least one selected from the group consisting of 3,3'-diethyl-4,4'-diaminodiphenylmethane and diethyltoluenediamine.

2. The encapsulant according to claim 1, wherein said rubber particles comprise an acrylic rubber.

3. As The encapsulant according to claim 2, wherein said rubber particles have a core/shell structure.

4. The encapsulant according to claim 3, wherein said rubber particles have:
   a core comprised of a rubbery polymer having a glass transition temperature of from −80° C. to 0° C.; and
   a shell comprised of a glassy polymer having a glass transition temperature of from 50° C. to 150° C.

5. The encapsulant according to claim 1, wherein the liquid aromatic amine is included in the epoxy resin composition in an amount of 60%–100% by weight based on the total weight of the curing agent.

6. The encapsulant according to claim 3, wherein polymer of the shell of the rubber particles has at least one functional group selected from the group consisting of carboxyl group, hydroxyl group and epoxy group.

7. The encapsulant according to claim 1, wherein the rubber particles have an average particle diameter in a range of 0.01 to 20 μm.

8. The encapsulant according to claim 1, wherein the rubber particles are mixed in the epoxy resin composition in an amount of from 1% to 30% by weight based on the total weight of the epoxy resin composition.

9. The encapsulant according to claim 1, wherein the diethyltoluenediamine is at least one selected from the group consisting of 3,5-diethyltoluene-2,4-diamine and 3,5-diethyltoluene-2,6-diamine.

10. An electronic device having an encapsulating member comprising a cured product of the encapsulant according to claim 1.

11. The encapsulant according to claim 1, wherein an equivalent weight ratio of the curing agent to the whole epoxy resin is in a range of 0.7:1 to 1.6:1.

12. The encapsulant according to claim 11, wherein said equivalent weight ratio is in a range of 0.9:1 to 1.2:1.

13. The encapsulant according to claim 1, wherein said liquid aromatic amine is 3,3'-diethyl-4,4'-diaminodiphenylmethane.

14. The encapsulant according to claim 1, wherein, in the epoxy resin composition, said epoxy resin, said curing agent, said inorganic filler and said rubber particles are uniformly dispersed and mixed.

15. The encapsulant according to claim 14, the epoxy resin, the curing agent, the inorganic filler and the rubber particles having been uniformly dispersed and mixed by kneading.

* * * * *